(12) United States Patent
Ling et al.

(10) Patent No.: US 9,900,974 B2
(45) Date of Patent: Feb. 20, 2018

(54) FLEX-LESS MULTILAYER CERAMIC SUBSTRATE

(71) Applicant: FINISAR CORPORATION, Sunnyvale, CA (US)

(72) Inventors: Wenhua Ling, San Jose, CA (US); Yan Yang Zhao, Fremont, CA (US); Yongsheng Liu, San Jose, CA (US); Yuheng Lee, San Jose, CA (US)

(73) Assignee: FINISAR CORPORATION, Sunnyvale, CA (US)

( * ) Notice: Subject to any disclaimer, the term of this patent is extended or adjusted under 35 U.S.C. 154(b) by 0 days.

(21) Appl. No.: 15/171,704

(22) Filed: Jun. 2, 2016

(65) Prior Publication Data

US 2017/0354026 A1    Dec. 7, 2017

(51) Int. Cl.
    *G02B 6/42*   (2006.01)
    *H05K 1/14*   (2006.01)
    *H05K 1/02*   (2006.01)
    *H05K 1/11*   (2006.01)
    *H05K 1/03*   (2006.01)
    *H05K 1/18*   (2006.01)

(52) U.S. Cl.
    CPC ............ *H05K 1/021* (2013.01); *G02B 6/428* (2013.01); *G02B 6/4246* (2013.01); *G02B 6/4269* (2013.01); *G02B 6/4272* (2013.01); *H05K 1/0204* (2013.01); *H05K 1/0274* (2013.01); *H05K 1/0298* (2013.01); *H05K 1/0306* (2013.01); *H05K 1/115* (2013.01); *H05K 1/144* (2013.01); *H05K 1/181* (2013.01); *H05K 2201/041* (2013.01); *H05K 2201/09509* (2013.01); *H05K 2201/10121* (2013.01)

(58) Field of Classification Search
    CPC .......................... G02B 6/4269; G02B 6/4272
    See application file for complete search history.

(56) References Cited

U.S. PATENT DOCUMENTS

| 2008/0247703 A1* | 10/2008 | Kodama | .............. G02B 6/4204 385/14 |
| 2013/0230272 A1* | 9/2013 | Raj | ........................ G02B 6/428 385/14 |

* cited by examiner

*Primary Examiner* — Jerry Rahll
(74) *Attorney, Agent, or Firm* — Maschoff Brennan (57) ABSTRACT

In one example embodiment, an optoelectronic assembly includes a multilayer ceramic substrate that includes multiple ceramic layers and a via disposed through at least one of the ceramic layers. The via may be formed from a conductive material that is configured to communicate a signal through the via. The multilayer ceramic substrate may be configured to dissipate heat emitted by an electronic component coupled to the multilayer ceramic substrate.

17 Claims, 7 Drawing Sheets

FLEX-LESS MULTILAYER CERAMIC SUBSTRATE

FIELD

The present disclosure generally relates to flex-less optoelectronic assemblies for signal transmission.

BACKGROUND

Unless otherwise indicated herein, the materials described herein are not prior art to the claims in the present application and are not admitted to be prior art by inclusion in this section.

Light signals (which may also be referred to as "optical signals") may be used to rapidly and reliably transmit information in a variety of applications such as fiber optic networks or computer systems.

The subject matter claimed herein is not limited to embodiments that solve any disadvantages or that operate only in environments such as those described above. Rather, this background is only provided to illustrate one example technology area where some embodiments described herein may be practiced.

SUMMARY

Some example embodiments described herein generally relate to flex-less optoelectronic assemblies for signal transmission.

In one example configuration, an optoelectronic assembly includes a multilayer ceramic substrate that includes multiple ceramic layers and a via disposed through at least one of the ceramic layers. The via may be formed from a conductive material that is configured to communicate a signal through the via. The multilayer ceramic substrate may be configured to dissipate heat emitted by an electronic component coupled to the multilayer ceramic substrate.

In another example configuration, a flex-less optoelectronic assembly may include a multilayer ceramic substrate that includes multiple ceramic layers and a via disposed through the ceramic layers. The via may extend between a first surface of the multilayer ceramic substrate and a second surface of the multilayer ceramic substrate. The second surface of the multilayer ceramic substrate may be oppositely positioned with respect to the first surface of the multilayer ceramic substrate. The flex-less optoelectronic assembly may also include a module board coupled to the first surface of the multilayer ceramic substrate. The module board may include a through hole that is substantially aligned with the via. The flex-less optoelectronic assembly may further include an electronic component physically coupled to the second surface of the multilayer ceramic substrate. The via may electrically couple the electronic component and the module board together.

In yet another example configuration, an optoelectronic assembly may include a multilayer ceramic substrate. The multilayer ceramic substrate may include multiple ceramic layers and a first via disposed through at least one of the ceramic layers. The first via may be formed from a conductive material that is configured to communicate a signal through the first via. The multilayer ceramic substrate may also include a first mount point configured to receive a first electronic component and to couple the first electronic component on a surface of the multilayer ceramic substrate. The first mount point may include at least a portion of the first via. The multilayer ceramic substrate may also include a second mount point configured to receive a second electronic component on the surface of the multilayer ceramic substrate. The second mount point may include at least a portion of a second via.

This Summary introduces a selection of concepts in a simplified form that are further described below in the Detailed Description. This Summary is not intended to identify key features or essential characteristics of the claimed subject matter, and it should not be used as an aid in determining the scope of the claimed subject matter.

Additional features and advantages of the disclosure will be set forth in the description which follows, and in part will be obvious from the description, or may be learned by the practice of the disclosure. The features and advantages of the disclosure may be realized and obtained by means of the instruments and combinations particularly pointed out in the appended claims. These and other features of the present disclosure will become more fully apparent from the following description and appended claims, or may be learned by the practice of the disclosure as set forth hereinafter.

BRIEF DESCRIPTION OF THE DRAWINGS

To further clarify the above and other advantages and features of the present disclosure, a more particular description of the disclosure will be rendered by reference to specific embodiments thereof which are illustrated in the appended drawings. It is appreciated that these drawings depict only typical embodiments of the disclosure and are therefore not to be considered limiting of its scope. The disclosure will be described and explained with additional specificity and detail through the use of the accompanying drawings in which.

DETAILED DESCRIPTION

The present disclosure generally relates to a flex-less optoelectronic assembly. The flex-less optoelectronic assembly may include a substrate and circuitry (e.g., transmitter circuit, receiver circuit, driver circuit). The substrate may include a multilayer ceramic substrate (hereafter "MLC"). Computer systems employing a flex-less optoelectronic assembly may experience improved performance when compared to other computers systems that use flex circuits. The performance of some computer systems may be restricted by a rate that computer processors may access memory or communicate with other components in the computer system. The restriction may be due, in part, to the physical limitations of data interconnects such as flex components (e.g., flex circuits and/or flex connectors). For example, some flex components of a particular size and/or surface area may only be capable of transmitting a specific amount of data, and in turn this may limit the maximum bandwidth for data signals. In some circumstances, such connections may result in bottlenecks when the maximum bandwidth of connections becomes a performance limiting factor. Further, without flex components, a flex-less optoelectronic assembly may instead route signals within the MLC which may avoid otherwise elongated paths through the flex components and around the heat sink as may typically be the case with systems that use flex components. Without the flex components, the flex-less optoelectronic assembly described may avoid flex interconnects and many flex related quality and reliability problems. In at least one embodiment, the MLC may also be formed from a material that may serve as a heat sink.

Reference will now be made to the drawings to describe various aspects of some additional embodiments. It is to be understood that the drawings are diagrammatic and schematic representations of the embodiments, and are not meant to be limiting, nor are they necessarily drawn to scale. Throughout the appended drawings, like numbers generally reference like structures unless described otherwise.

Figure 1A:
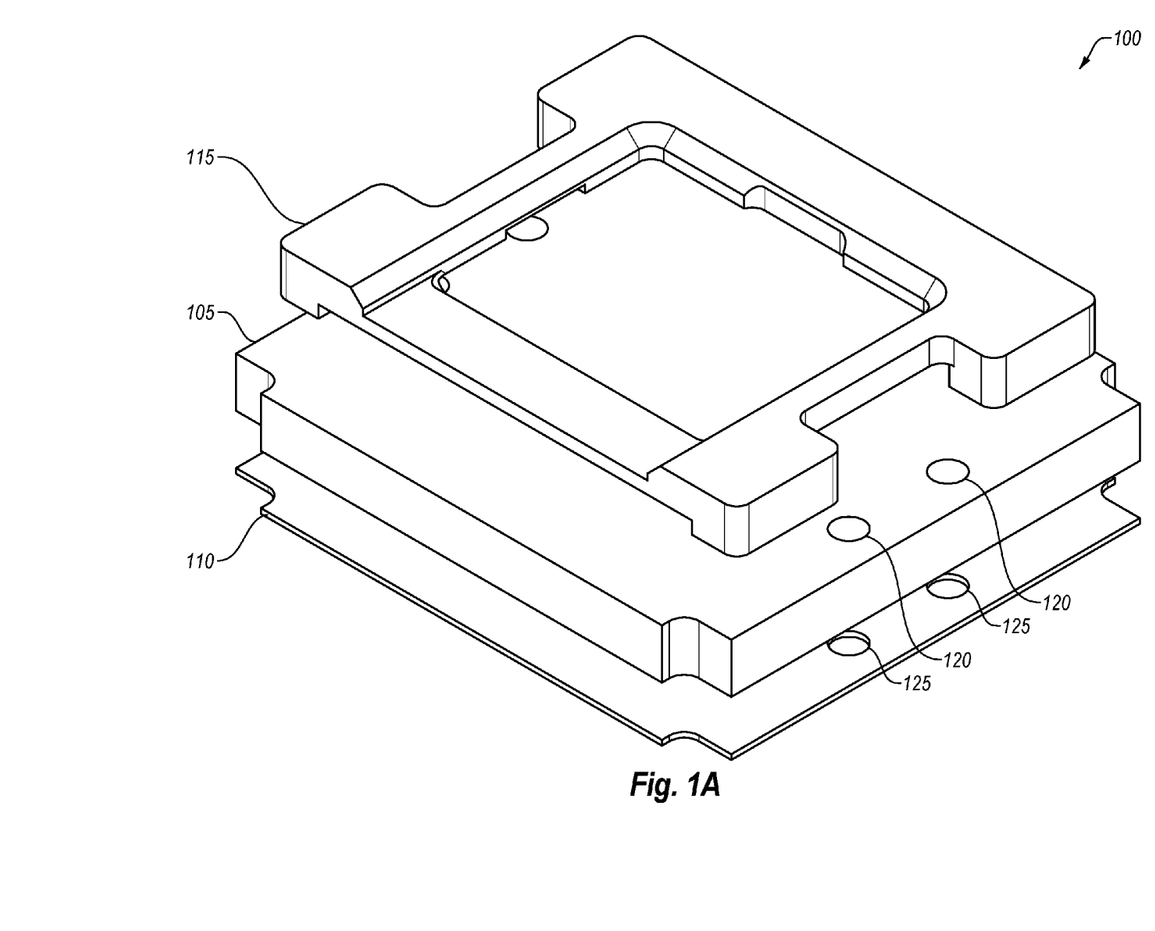
FIG. 1A is a schematic representation of an example flex-less optoelectronic assembly.

FIG. 1A is a schematic representation of an example flex-less optoelectronic assembly 100. The flex-less optoelectronic assembly 100 illustrated in FIG. 1 may include an optical engine, although the embodiments described herein are not limited to optical engines. The flex-less optoelectronic assembly 100 may be implemented as part of a fiber optic network and/or a computing system. In some configurations, the flex-less optoelectronic assembly 100 may be used to convert electrical signals to optical signals which then travel through fiber optic cables of the fiber optic network and/or computing system. Additionally or alternatively, the flex-less optoelectronic assembly 100 may convert optical signals to electrical signals. The flex-less optoelectronic assembly 100 may be configured to receive either one or multiple electrical signals and/or optical signals. The flex-less optoelectronic assembly 100 may also be configured to output either one or multiple electrical signals and/or optical signals. In these and other embodiments, the flex-less optoelectronic assembly 100 may be designed for high-speed (e.g., 25 gigabits per second (G) or higher) optical interconnects between integrated circuits and/or between circuit boards. In some embodiments, the flex-less optoelectronic assembly 100 may be designed for low-speed (e.g., 25 gigabits per second (G) or lower) optical interconnects between integrated circuits and/or between circuit boards.

The flex-less optoelectronic assembly 100 may include a MLC 105, a module board 110, and a heat sink 115. The module board 110 may include a printed circuit board (PCB). In the depicted configuration, the MLC 105 is mounted to the module board 110, and the heat sink 115 is mounted to the MLC 105. In this and other embodiments, the MLC 105 may be removably secured to the module board 110 or another structure using one or more fasteners (not shown), for instance. Similarly, in this and other embodiments, the heat sink 115 may be removably secured to the MLC 105 or another structure using one or more fasteners (not shown), for instance. In at least one embodiment, the MLC 105 may include one or more through holes 120 by which the MLC 105 may be removably secured to other structures (e.g., the module board 110, heat sink 115). Similarly, the module board 110 may include one or more holes 125 by which the module board 110 may be removably secured to other structures (e.g., the MLC 105). The heat sink 115 may also include one or more holes (not illustrated) by which the heat sink 115 may be removably secured to other structures (e.g., the MLC 105). In at least one embodiment, the MLC 105 and the heat sink 115 may be more permanently secured together, such as being welded or brazed together.

The MLC 105 may include any number of ceramic layers and may be any shape or size. For example, the MLC 105 may include ten layers, twenty layers, forty layers, etc. As illustrated, the MLC 105 is a substantially rectangular or square shape with a particular thickness. The illustrated MLC 105 includes a first surface (e.g., a top surface) and a second surface (e.g., a bottom surface). The first surface may include any number of components (e.g., heat-generating components 150 of FIG. 1B).

Each of the ceramic layers of the MLC 105 may be formed from a same or similar material. Alternatively, one or more of the ceramic layers may be formed from a different material with respect to other ceramic layers. In at least one embodiment, one or more of the ceramic layers may be formed from a copper-based ceramic material. In at least one embodiment, one or more of the ceramic layers may be formed from a low-semiconductivity ceramic material, such as aluminum oxide. In at least one embodiment, one or more of the ceramic layers may be formed from a high-semiconductivity ceramic material, such as aluminum nitride. The material from which the MLC 105 is made from may be determined based on one or more desired thermal characteristics or properties of the resulting MLC 105. Thermal energy generated during operation may be absorbed by the MLC 105. The MLC 105 may be configured such that the thermal energy absorbed from the heat-generating components may be dissipated. In at least one embodiment, the MLC 105 may dissipate thermal energy absorbed from the heat-generating components without the use of any other heat sinks (e.g., without using heat sinks 115).

Figure 2A:
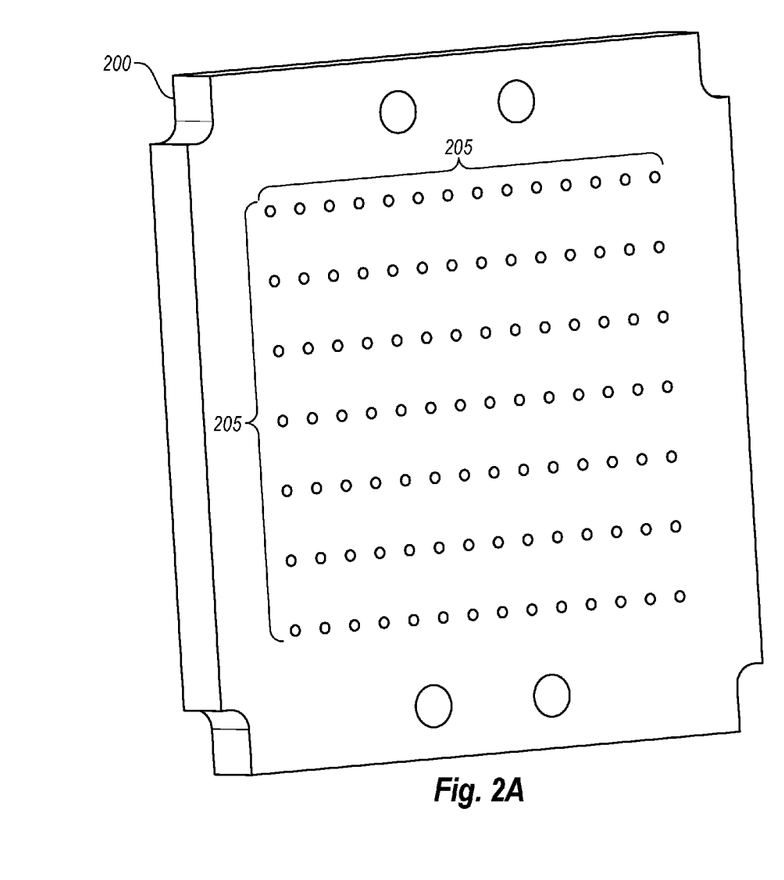
FIG. 2A is perspective view of an example multilayer ceramic substrate.

In some configurations the MLC 105 may include one or more vias extending through one or more ceramic layers of the MLC 105 to electrically and/or thermally couple components to each other and/or to the heat sink 115. An example MLC 200 with multiple vias is further described with respect to FIG. 2.

In some configurations, heat may be dissipated through the heat sink 115 and/or the MLC 105. A first side of the heat sink 115 may be mechanically and thermally coupled to the MLC 105. In at least one embodiment, the heat sink 115 may be configured to absorb thermal energy generated during operation of one or more heat-generating components and dissipate the thermal energy. The heat sink 115 may include thermally conductive material and may permit heat to dissipate from portions of the flex-less optoelectronic assembly 100. For example, the heat sink 115 may be composed, at least partially, of copper. Alternatively or additionally, the heat sink 115 may be composed, at least partially, of gold, silver, other metals and/or metal alloys, other thermally conductive material(s), or a combination of materials. In some embodiments, the heat sink 115 may be a single piece or one or more portions may be manufactured independently and attached to the other portions. In these and other embodiments, the portions may be composed of the same or differing materials. The heat sink 115 may be positioned with respect to the heat-generating components 150 such that the thermal energy generated during operation may be absorbed by the heat sink 115. The heat sink 115 may be configured such that the thermal energy absorbed from the heat-generating components may be dissipated. In some configurations, heat may be dissipated through the heat sink 115 to air in a surrounding environment and/or to a housing or other component in contact with the heat sink 115. In some embodiments, at least a portion of the heat sink 115 may be integrated into the MLC 105, as further described with respect to FIGS. 3A and 3B.

In at least one embodiment, the MLC 105 may be thermally coupled to the module board 110. The MLC 105 may include a material with relatively high thermal conductivity and may permit heat to dissipate from portions of the flex-less optoelectronic assembly 100. In at least one embodiment, the MLC 105 may include material with a coefficient of thermal expansion (hereafter, "CTE") that is similar to a CTE of the module board 110 and/or a CTE of the heat sink 115. When the CTE of the MLC 105 and the CTE of the module board 110 are similar, for example, an amount of thermal stress between the MLC 105 and the module board 110 may be reduced. In at least one embodiment, the CTE of the MLC 105 may be between $5 \times 10^{-6}$ to $10 \times 10^{-6}$ m/m° C. In at least one embodiment, a difference between the CTE of the MLC 105 and either or both of the CTE of the module board 110 and the heat sink 115 is less than ten times (10×) the CTE of the MLC 105.

Figure 1B:
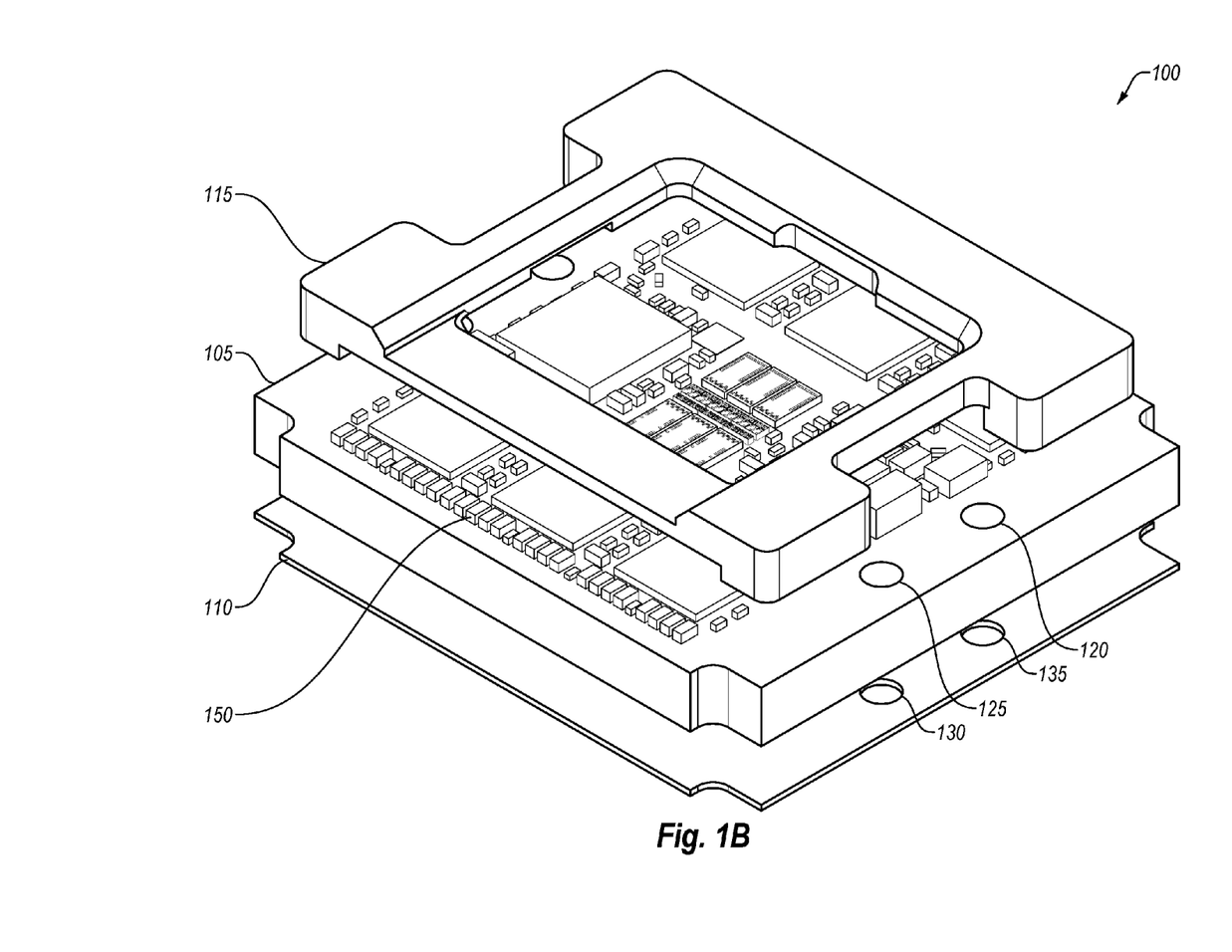
FIG. 1B illustrates a flex-less optoelectronic assembly with one or more heat-generating components.

FIG. 1B illustrates the flex-less optoelectronic assembly 100 with one or more heat-generating components 150. The flex-less optoelectronic assembly 100 may include one or more optical components, electronic components, and intra-component connections used in optical and/or electrical communication. The optical components, electronic components, and intra-component connections are collectively referred to herein as "heat-generating components" and are represented by component 150. The heat-generating components 150 may include a lens, a laser or another optical transmitter, a p-region/intrinsic region/n-region (PIN) photodiode or another optical receiver, a CDR chip, a monitor photodiode, a transmitter circuit, a driver circuit, a receiver circuit etc. One or more of the heat-generating components 150 may be mounted to the MLC 105 and/or to the module board 110. As used to describe relationship between the heat-generating components 150 and the MLC 105 and/or the module board 110, the term "mounted" may include physically and/or electrically coupling the heat-generating components 150 to the MLC 105 and/or to the module board 110. One or more of the heat-generating components 150 may be coupled to a surface of the MLC 105. The one or more of the heat-generating components 150 may also be electrically coupled to the module board 110 by one or more vias through the MLC 105.

Figure 1C:
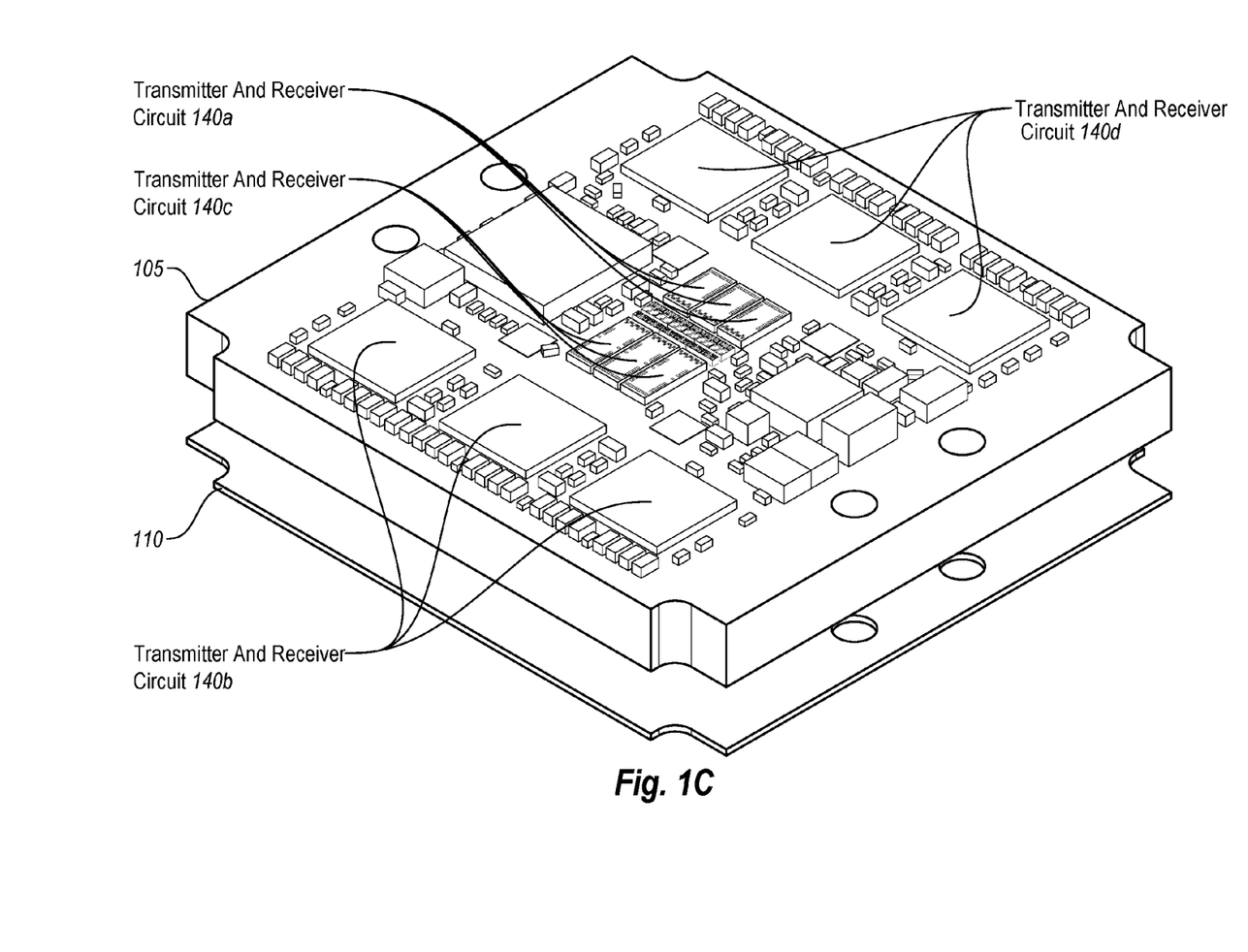
FIG. 1C illustrates the flex-less optoelectronic assembly with at least one transmitter circuit and a receiver circuit

FIG. 1C illustrates the flex-less optoelectronic assembly 100 with at least one transmitter circuit and a receiver circuit 140 The transmitter circuit may be optically and mechanically coupled to optical fibers. The receiver circuit may be optically and mechanically coupled to one or more optical fibers. The transmitter circuit may include a transmitter array or a laser array oriented to emit optical signals through the optical fibers. The receiver circuit may include a receiver array oriented to receive optical signals through the optical fibers. The transmitter circuit may be electrically coupled to a driver circuit configured to drive the transmitter array of the transmitter circuit to emit optical signals. For example, the driver circuit may be coupled to the transmitter circuit by an electrical coupling such as a lead attached to a solder bond, although other suitable configurations may be implemented.

The transmitter circuit may include a single optical transmitter or an array of optical transmitters, such as semiconductor lasers, light emitting diodes, vertical cavity surface-emitting lasers (VCSELs), edge-emitting lasers, distributed feedback (DFB) lasers, distributed Bragg reflector (DBR) lasers, or any other suitable optical transmitters. In some configurations, the transmitter circuit may include an optical transmitter corresponding to each of the optical fibers. In some configurations, the transmitter circuit may include at least one monitor photodiode (MPD), and/or one MPD corresponding to each of the optical transmitters of the transmitter circuit.

The driver circuit may include a silicon germanium integrated circuit driver or any other suitable driver circuit. Each of the optical transmitters of the transmitter circuit may be driven by a drive signal from the driver circuit thereby causing each of the optical transmitters to emit a corresponding optical signal representative of information.

The transmitter circuit may be positioned against and/or mechanically coupled to the MLC 105 or to the module board 110. Additionally or alternatively, the transmitter circuit may be positioned against and/or mechanically coupled to the driver circuit. In some configurations the driver circuit and the MLC 105 may be substantially coplanar to one another.

The driver circuit may be electrically coupled to the transmitter circuit by electrical couplings such as one or more vias and/or traces in the MLC 105. The transmitter circuit may be electrically coupled to the MLC 105, for example, by one or more vias and/or traces in the MLC 105. Additionally or alternatively, such traces may be positioned on or in and/or formed on or in a surface or one or more layers of the MLC 105.

The receiver circuit may include a single optical receiver or an array of optical receivers, such as photodiodes, photoresistors, reverse-biased light-emitting diodes (LEDs), photodetectors, or any other suitable components capable of detecting light. In some configurations, the receiver circuit may include an optical receiver corresponding to each of the optical fibers. The receiver circuit may be positioned against and/or mechanically coupled to the MLC 105 or the module board 110. The receiver circuit may be electrically coupled to the MLC 105, for example, by one or more vias and/or traces in the MLC 105.

FIG. 2A is perspective view of an example MLC 200. The MLC 200 may include any of the same or similar aspects as described with respect to the MLC 105 of FIG. 1. The MLC 200 may include any number of vias 205 through any number of layers in the MLC 200. The vias 205 may include one or more through hole vias, one or more buried vias and/or one or more blind vias. A through hole via may include a via that extends through all layers of the MLC 200. A buried via may include a via that extends through at least one internal layer of the MLC 200 (e.g., the buried via may not extend to any outer surfaces of the MLC 200). A buried via may include a via that extends from an outer surface of the MLC 200 and through at least one internal layer of the MLC 200 (e.g., the buried via may not extend to more than one outer surface of the MLC 200). Two or more vias may be coupled by a conductor. The conductor may include a conductive layer disposed between two ceramic layers in the MLC and/or a trace. The conductor and two or more vias may couple two or more components to each other. In an example, a first component may be electrically coupled to a first via. The first via may be electrically coupled to a conductor. The conductor may be electrically coupled to a second via and the second via may be electrically coupled to a second component. Accordingly, the first component may be electrically coupled to the second component through the intervening first via, conductor, and second via.

The vias 205 may be arranged in any pattern. As illustrated, the vias 205 are arranged on the MLC 200 where the vias are spaced equally by a first distance in a first direction (e.g., horizontal) and are spaced equally by a second distance in a second direction (e.g., vertical). In at least one embodiment, the first distance and the second distance are the same value. In at least one embodiment, the vias may be spaced randomly in one or more directions. In at least one embodiment, the vias may be placed according to geometry of components to be mounted or connected to the MLC 200. Such components may include the heat generating components 150 of FIG. 1. For example, at least some of the vias may be arranged to accommodate pins of one or more particular components.

Each layer of the MLC 200 may include any number of vias 205. Signals may travel through the layers of the MLC 200 using the vias and without using flex components. Signals that travel through the ceramic layers may travel a shorter distance and thus may have higher speed and performance as compared to conventional systems that may use flex components. Each via 205 may include conductive material that permits electrical coupling between components. The vias 205 may further permit signals to travel through the conductive material. In at least one embodiment, some vias 205 may not include any material within the via, which may be configured to accommodate a connector pin of a heat-generating component 150. The MLC 200 may include vias extending between one or more of a transmitter circuit, a driver circuit, and a receiver circuit, and a heat sink (e.g., heat sink 115) to couple the transmitter circuit, the driver circuit, and the receiver circuit to each other and/or to thermally couple to the heat sink. Heat may be dissipated out of the heat sink on surfaces of the heat sink that are not coupled to components such as the MLC 200.

In at least one embodiment, a via may be disposed along an axis that is perpendicular to two or more layers in the MLC 200. The via may extend between a first surface of the MLC 200 and a second surface of the MLC 200. The second surface of the MLC 200 may be oppositely positioned with respect to the first surface of the MLC 200.

Figure 2B:
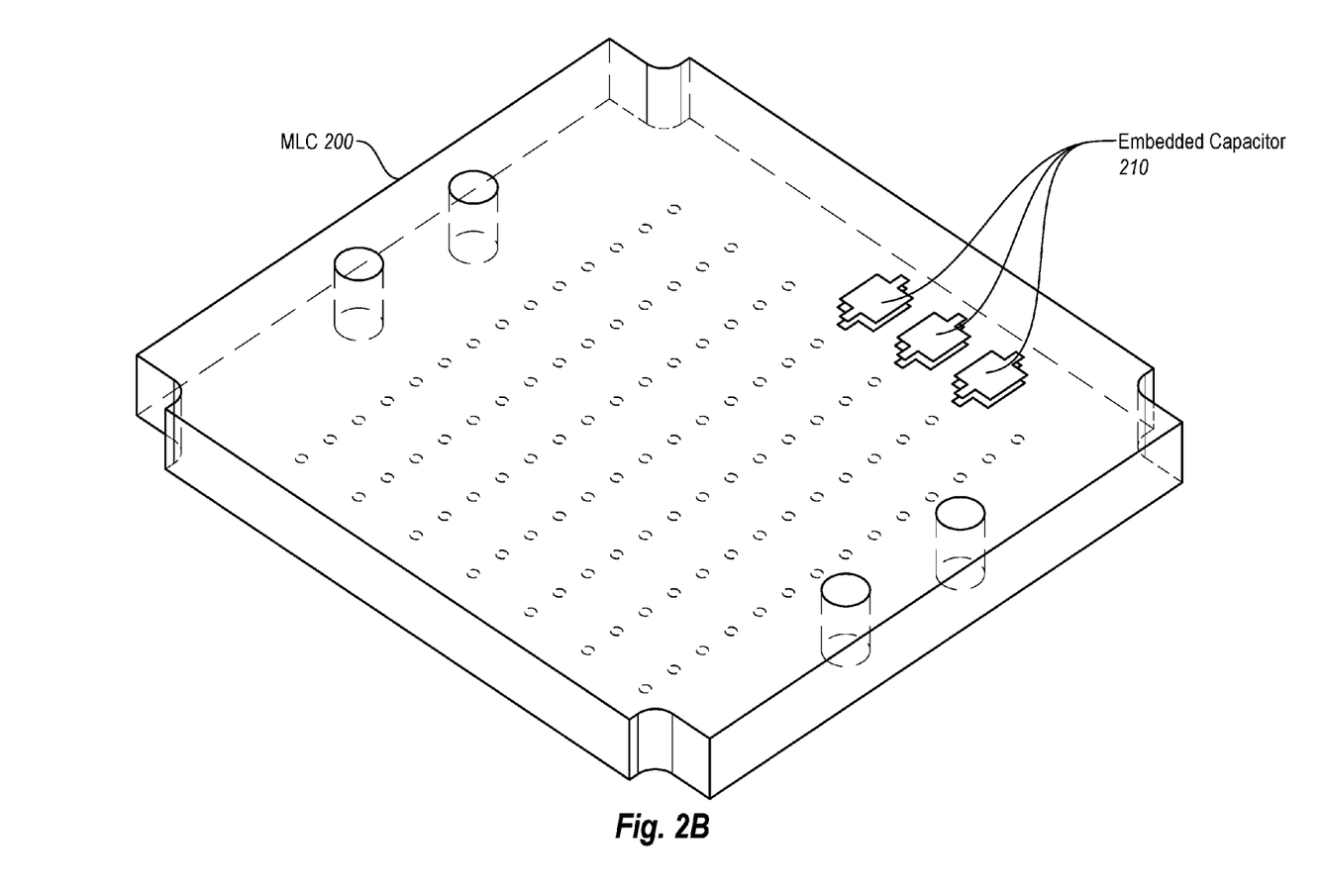
FIG. 2C illustrates an example MLC and an example module board.

FIG. 2B illustrates an example MLC 200 that includes one or more embedded capacitors, resistors and/or inductors 210. As illustrated, the MLC 200 includes three embedded capacitors 210. The one or more embedded capacitors, resistors and/or inductors 210 may be physically and/or electrically coupled to one or more vias. For example, an embedded capacitor, resistor or inductor 210 may be disposed between two layers in the MLC 200. In another example, two embedded capacitors, resistors and/or inductors 210 may be electrically coupled by one or more vias. In a further example, an embedded capacitor, resistor or inductor 210 may be encapsulated within the MLC 200.

Figure 2C:
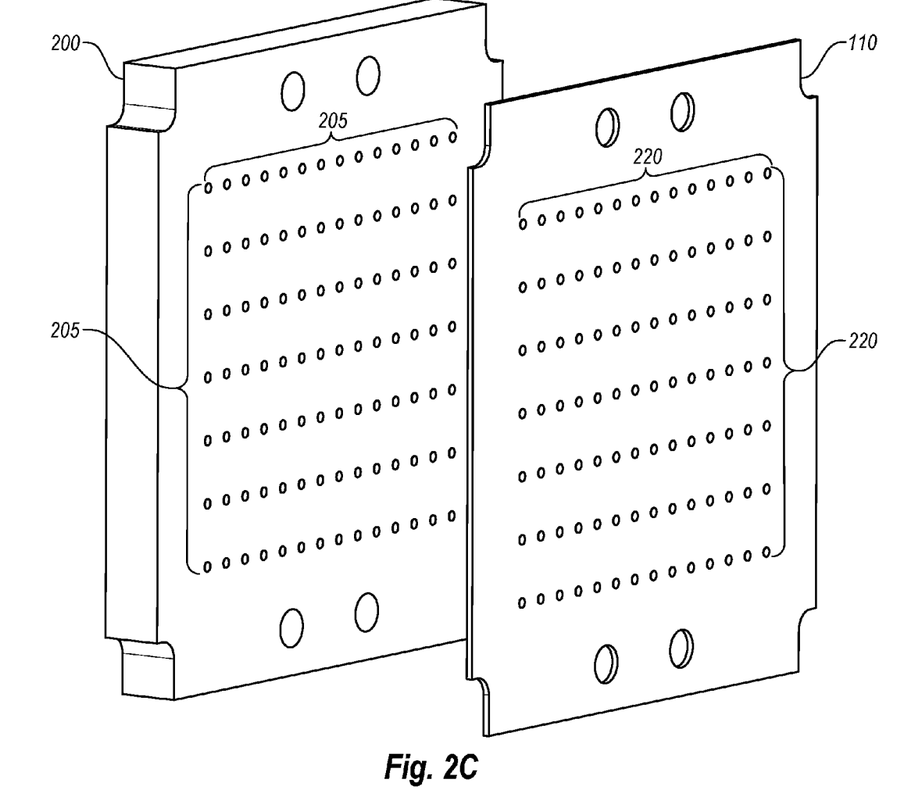

FIG. 2C illustrates an example MLC 200 and an example module board 110. The MLC 200 may include any number of vias 205 through any number of layers in the MLC 200. The module board 110 may include any number of through holes 220. Any of the through holes 220 may be aligned with any of the vias 205. For example, the module board 110 may include a through hole 220 that is substantially aligned with a via 205.

Figure 3A:
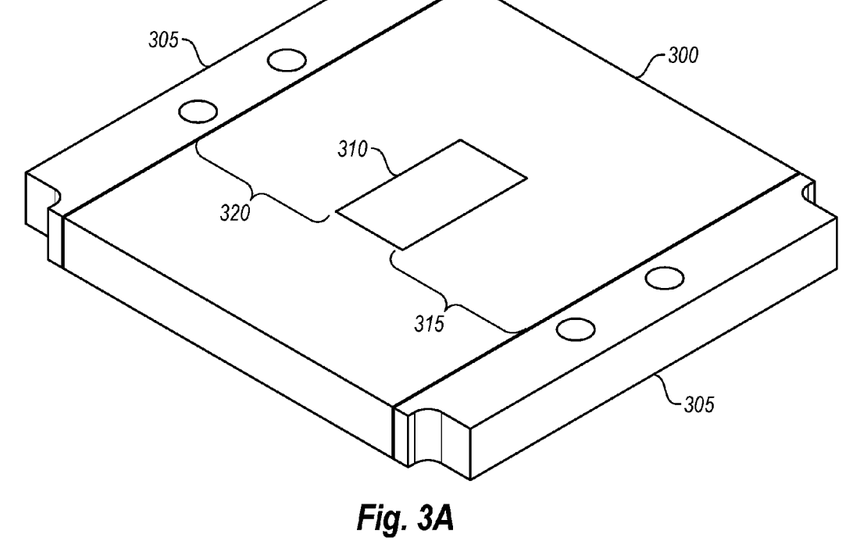
FIG. 3A illustrates an example multilayer ceramic substrate with an integrated heat sink.

FIG. 3A illustrates an example MLC 300 with an integrated heat sink 305. The integrated heat sink 305 may be coupled to multiple surfaces of the MLC 300. The MLC 300 may include similar features as the MLC 105 of FIGS. 1A and/or 1B. The heat sink 305 may include similar features as the heat sink 115 of FIG. 1B. With an integrated heat sink 305 in the MLC 300, the thermal performance may be further enhanced.

The heat sink 305 may be brazed to MLC 300, which may permit a high data rate for parallel applications, even where power dissipation may be normally localized in a small area. In at least one embodiment, thermal epoxy or a phase change layer may be omitted between the MLC 300 and the heat sink 305. As illustrated, the heat sink 305 is disposed on a first side of the MLC 300 and on a second side of the MLC 300.

In at least one embodiment, the MLC 300 may also include one or more interstitial heat sinks 310 that may be disposed between at least two areas 315, 320 of MLC 300. The one or more interstitial heat sinks 310 may be disposed in any location on the MLC 300. Some optical and electrical components, such as components with higher power dissipation or heat emission, may be mounted to the interstitial heat sink 310. Other components with a lower power dissipation or heat emission may be mounted to the MLC 300.

Figure 3B:
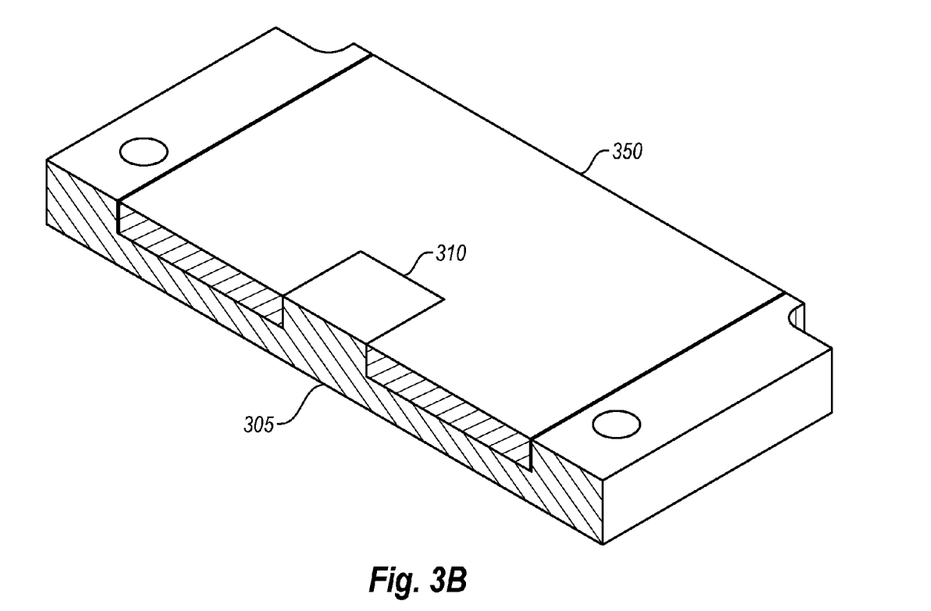
FIG. 3B is a section view of a multilayer ceramic substrate with an integrated heat sink, all arranged in accordance with at least one embodiment described herein.

FIG. 3B is a section view of a MLC 350 with an integrated heat sink. The MLC 350 may include the MLC 300 of FIG. 3A or may include a different MLC. As illustrated, the one or more interstitial heat sinks 310 may extend through the MLC 350 such that the one or more interstitial heat sinks 310 may be externally exposed. The one or more interstitial heat sinks 310 may be coupled to the heat sink 305.

The terms and words used in this description and claims are not limited to the bibliographical meanings, but, are merely used to enable a clear and consistent understanding of the disclosure. It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those skilled in the art, may occur in amounts that do not preclude the effect the characteristic was intended to provide.

Aspects of the present disclosure may be embodied in other forms without departing from its spirit or essential characteristics. The described aspects are to be considered in all respects illustrative and not restrictive. The claimed subject matter is indicated by the appended claims rather than by the foregoing description. All changes which come within the meaning and range of equivalency of the claims are to be embraced within their scope.

What is claim is:

1. A flex-less optoelectronic assembly comprising:
a multilayer ceramic substrate that includes a plurality of ceramic layers and a via disposed through the plurality of ceramic layers, the via extending between a first surface of the multilayer ceramic substrate and a second surface of the multilayer ceramic substrate, the second surface of the multilayer ceramic substrate being oppositely positioned with respect to the first surface of the multilayer ceramic substrate;
a module board coupled to the first surface of the multilayer ceramic substrate, the module board including a through hole that is substantially aligned with the via;
an electronic component physically coupled to the second surface of the multilayer ceramic substrate, the via electrically coupling the electronic component and the module board and
a heat sink physically coupled to the second surface of the multilayer ceramic substrate, the heat sink being configured to dissipate heat emitted by the electronic component.

2. The flex-less optoelectronic assembly of claim 1, wherein the electronic component is configured to simultaneously transmit and receive data over multiple optical fibers.

3. The flex-less optoelectronic assembly of claim 1, wherein the multilayer ceramic substrate is configured to dissipate heat emitted by the electronic component.

4. The flex-less optoelectronic assembly of claim 1, wherein the heat sink is at least partially integrated with the multilayer ceramic substrate.

5. The flex-less optoelectronic assembly of claim 4, wherein the heat sink comprises an interstitial heat sink component that is disposed between at least two areas of the multilayer ceramic substrate.

6. The flex-less optoelectronic assembly of claim 1, wherein at least one surface of the heat sink is brazed to the multilayer ceramic substrate.

7. The flex-less optoelectronic assembly of claim 1, wherein the heat sink comprises a first material with a first coefficient of thermal expansion, and wherein the multilayer ceramic substrate comprises a second material with a second coefficient of thermal expansion.

8. The flex-less optoelectronic assembly of claim 7, wherein the first coefficient of thermal expansion is within ten times the second coefficient of thermal expansion.

9. The flex-less optoelectronic assembly of claim 8, wherein the multilayer ceramic substrate comprises a second material with a second coefficient of thermal expansion, wherein the module board comprises a third material with a third coefficient of thermal expansion, wherein the third coefficient of thermal expansion is within ten times the second coefficient of thermal expansion.

10. An optoelectronic assembly comprising:
   a multilayer ceramic substrate that comprises:
      a plurality of ceramic layers and a first via disposed through at least one of the plurality of ceramic layers, the first via being formed from a conductive material that is configured to communicate a signal through the first via;
      a first mount point configured to receive a first electronic component and to couple the first electronic component on a surface of the multilayer ceramic substrate, the first mount point including at least a portion of the first via;
      a second mount point configured to receive a second electronic component on the surface of the multilayer ceramic substrate, the second mount point including at least a portion of a second via; and
   a heat sink physically coupled to the surface of the multilayer ceramic substrate, the heat sink being configured to dissipate heat emitted by the first electronic component and the second electronic component, wherein the heat sink is at least partially integrated with the multilayer ceramic substrate.

11. The optoelectronic assembly of claim 10, further comprising the first electronic component, wherein the first electronic component is configured to simultaneously transmit and receive data over multiple optical fibers.

12. The optoelectronic assembly of claim 10, wherein the first via is a blind via and is coupled to the second via by a conductor.

13. The optoelectronic assembly of claim 10, wherein the multilayer ceramic substrate is configured to dissipate heat emitted by the first electronic component and the second electronic component.

14. The optoelectronic assembly of claim 10, wherein at least one surface of the heat sink is brazed to the multilayer ceramic substrate.

15. The optoelectronic assembly of claim 10, wherein the heat sink comprises a first material with a first coefficient of thermal expansion, wherein the multilayer ceramic substrate comprises a second material with a second coefficient of thermal expansion.

16. The optoelectronic assembly of claim 15, wherein the first coefficient of thermal expansion is within ten times the second coefficient of thermal expansion.

17. The optoelectronic assembly of claim 10 further comprising a module board, wherein the multilayer ceramic substrate of a second material with a second coefficient of thermal expansion, wherein the module board is composed of a third material with a third coefficient of thermal expansion, wherein the third coefficient of thermal expansion is a number within ten times the second coefficient of thermal expansion.

* * * * *